(12) United States Patent
Jönsson et al.

(10) Patent No.: US 7,961,051 B2
(45) Date of Patent: Jun. 14, 2011

(54) ENHANCED LOW NOISE AMPLIFIER

(75) Inventors: Jonas Jönsson, Sundbyberg (SE);
Martin Sanden, Täby (SE)

(73) Assignee: DIBCOM, Palaiseau (FR)

( * ) Notice: Subject to any disclaimer, the term of this patent is extended or adjusted under 35 U.S.C. 154(b) by 498 days.

(21) Appl. No.: 12/086,517

(22) PCT Filed: Dec. 14, 2006

(86) PCT No.: PCT/IB2006/003622
§ 371 (c)(1),
(2), (4) Date: Jun. 13, 2008

(87) PCT Pub. No.: WO2007/069060
PCT Pub. Date: Jun. 21, 2007

(65) Prior Publication Data
US 2010/0214493 A1  Aug. 26, 2010

(30) Foreign Application Priority Data
Dec. 14, 2005  (EP) ..................... 05292674

(51) Int. Cl.
*H03F 3/04* (2006.01)
(52) U.S. Cl. ........................ 330/305; 330/302
(58) Field of Classification Search .......... 330/305, 330/302
See application file for complete search history.

(56) References Cited

U.S. PATENT DOCUMENTS

| | | | | |
|---|---|---|---|---|
| 4,263,611 A * | 4/1981 | Gibson et al. | ................ | 348/726 |
| 6,329,886 B1 * | 12/2001 | Ogoro | ............... | 333/32 |
| 6,366,166 B1 | 4/2002 | Belot | | |
| 6,882,223 B2 * | 4/2005 | Hsu et al. | ............ | 330/252 |
| 7,539,470 B2 * | 5/2009 | Kim et al. | ............. | 455/130 |
| 7,548,734 B2 * | 6/2009 | Lin et al. | ............... | 455/130 |
| 7,768,348 B2 * | 8/2010 | Banba | ............... | 330/253 |
| 2003/0206076 A1 | 11/2003 | Hashemi et al. | | |

FOREIGN PATENT DOCUMENTS
EP  1 054 510  11/2000
WO  WO 2004/010576  1/2004

\* cited by examiner

*Primary Examiner* — Patricia Nguyen
(74) *Attorney, Agent, or Firm* — McKenna Long & Aldridge LLP

(57) ABSTRACT

This amplifier (10) for radio frequency signals comprises a circuit adapted to amplify the signals within a first range of frequency (19) and is characterized in that said circuit is also adapted to simultaneously attenuate the signals within a second range of frequency (18).

22 Claims, 2 Drawing Sheets

ENHANCED LOW NOISE AMPLIFIER

This application claims priority from PCT/IB2006/003622, filed Dec. 14, 2006 and from European Application EP 05292674.8, filed Dec. 14, 2005, both of which are hereby incorporated by reference in their entireties.

BACKGROUND OF THE INVENTION

The present invention concerns amplifiers for radio frequency (RF) signals and more especially, so-called low noise amplifiers and corresponding receivers.

Conventionally, RF signals are received and processed through a so-called analog front end, part of this processing includes amplifying the signal by low noise amplifiers.

However, the frequency band is always more occupied and signals tend to be closer to each other in frequency. For example, digital television signals extend up to 750 MHz while GSM signals start at 900 MHz. Due to unavoidable non-linearity, the receivers happen to process unwanted signals from nearby frequency ranges.

These unwanted signals are conventionally rejected by use of notch filters which are adapted to reject specified ranges of frequencies. These filters are conventionally placed downstream from the low noise amplifiers.

Accordingly, unwanted signals are still amplified before being rejected. This leads to a sub-optimal amplification as the energy of these unwanted signals are amplified. This leads to lower signal amplification to avoid saturation of the amplifiers and therefore higher noise for the system.

Inverting the order of these components to place the low noise amplifier downstream from the notch filter would lead to a loss of useful signal, as the useful signal is reduced by the filter while the noise is at the same level.

Accordingly, conventional receivers must be designed to balance the loss of useful signals and the sub-optimal amplification.

Some existing devices, such as the one described in the document EP1054510, are designed especially for amplification and have some attenuation as a side effect without any selectivity.

SUMMARY OF THE INVENTION

The aim of the present invention is to solve this problem by providing an enhanced low noise amplifier and a corresponding receiver.

To this effect, the invention relates to an amplifier for radio frequency signals comprising a first stage being connected between the input, a ground and an output and a second stage being connected between the output and a direct voltage source, and wherein said second stage provides a direct current path with a first inductor, the circuit further comprising a first capacitor connected in parallel with said direct current path and a second inductor series-connected with a second capacitor wherein the values of said first and second inductors and of said first and second capacitors are set to have predetermined ratios to amplify the signals within a first range of frequency and simultaneously attenuate the signals within a second range of frequency and wherein each of the couples of inductor and capacitor allows setting of respectively the central attenuation frequency and the central amplification frequency.

The invention also relates to a corresponding receiver.

Thanks to the fact that the amplification of a determined range of frequency and the attenuation of another separated range of frequency are carried out simultaneously by the same circuit, the signals to be amplified are never attenuated. Likewise, the signals to be attenuated are never amplified.

BRIEF DESCRIPTION OF THE DRAWINGS

Other features and advantages of the invention will be apparent from the description illustrated by the drawings in which:

FIG. 1 represents a receiver 2 adapted to receive through an antenna 4, radio frequency (RF) signals, like digital television signals using the MPEG2 format in a DVB-H or DVB-T transmission.

Figure 1:
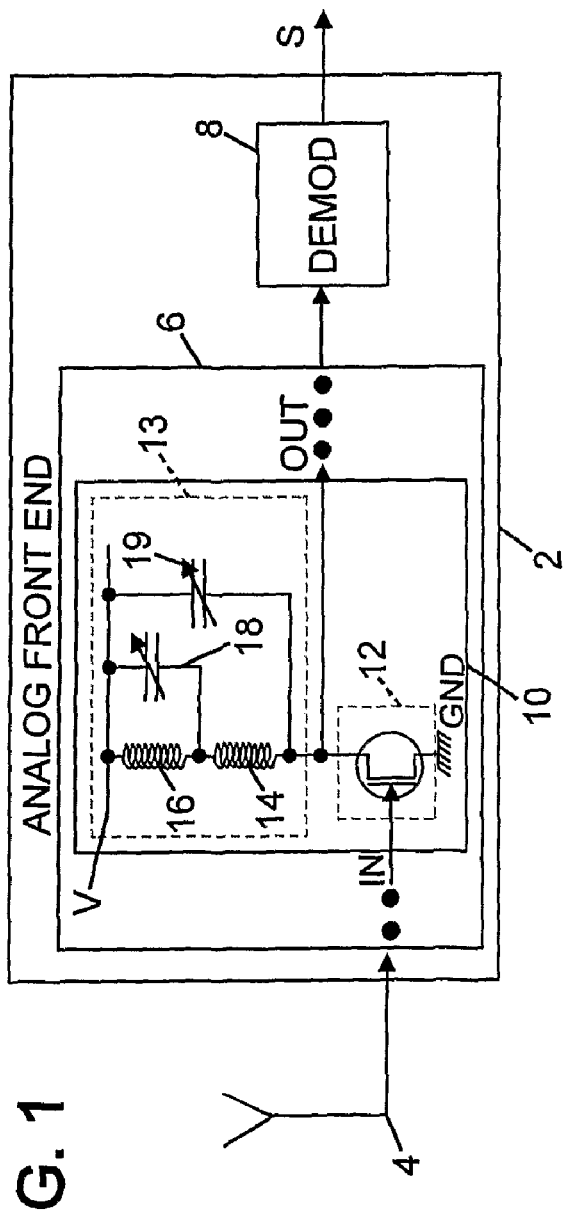
FIG. 1 represents the circuit of an amplifier according to a first embodiment of the invention.

An analog front end 6 is connected down stream of the antenna 4. The output of the analog front end 6 is fed into a demodulation unit 8 applying the relevant demodulation or equalization processing to derive an information signal S supplied to other processing circuits with which the receiver 2 is associated.

Along with other components, the analog front end 6 comprises an enhanced low noise amplifier 10 according to the invention.

This low noise amplifier 10 is a single circuit adapted to amplify a determined range of frequency and simultaneously attenuate another separate range of frequency. It comprises a first input stage 12 connected between the input IN of the amplifier, the output OUT and the ground GND.

The input stage 12 is conventional and can comprise for example a single CMOS or bipolar transistor connected between the input, the output and the ground as represented in FIG. 1. The input stage 12 can also comprise an amplifying transistor, a cascode connected transistor and an inductor or other biasing circuits or any well known input circuits.

The output OUT of the input stage 12 is connected to a direct voltage source V through a second stage 13 performing the amplification and providing the current for the output signal.

In the first described example, the second stage 13 comprises two series-connected inductors 14 and 16 providing a direct current path to perform the amplification. A capacitor 18 is connected in parallel with the inductor 16 connected to the voltage source V.

Another capacitor 19 is connected in parallel with both inductors 14 and 16, i.e. between the output and the direct voltage source.

The capacitors 18 and 19 are both tuneable components while the inductors 16 and 19 have determined values.

Typical component values for this embodiment are: inductor 14, 10 nH; inductor 16, 4 nH; capacitor 18, 12 pF; and capacitor 19, 2 pF.

This circuit 10 performs simultaneously the amplification of a determined range of frequency and the attenuation of another range of frequency.

More specifically, the inductor 14 and the capacitor 18 are in series resonance to attenuate the signal. Simultaneously, the overall inductor formed by inductors 14 and 16 and the capacitor 19 are in parallel resonance to amplify the signal.

In the example, it is possible to set the center value of the amplified range of frequency by tuning the value of the capacitor 19. Furthermore, it is possible to set the center value of the attenuated range of frequency by tuning the value of the capacitor 18.

Figure 2:
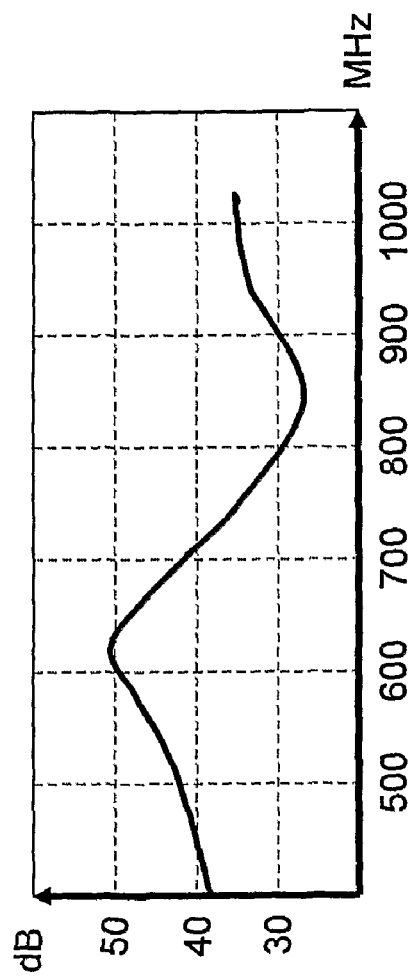
FIG. 2 is a representation of the transfer function of the circuit of FIG. 1.

The transfer function of this enhanced amplifier is represented with reference to FIG. 2.

This transfer function has a peak corresponding to the center value of the amplified range of frequency which, in the example, is set around 650 MHz. Furthermore, the transfer function has a notch corresponding to the center of the attenuated range of frequency, which in the example is set to 850 MHz.

Accordingly, this enhanced amplifier 10 allows receiving and amplifying signals up to 750 MHz while simultaneously attenuating signals at upper frequencies and especially, GSM signals between 824 and 915 MHz.

Figure 3:
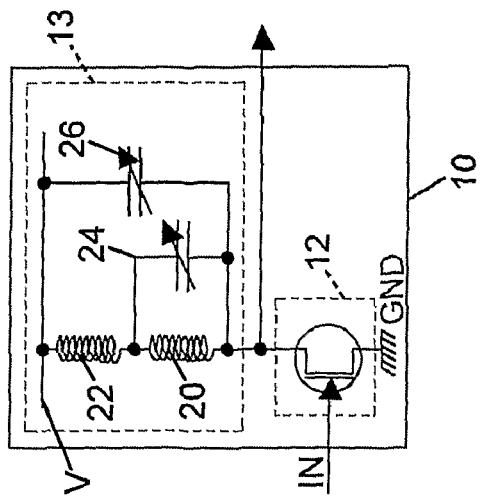
FIGS. 3 and 4 represent the circuits of two other embodiments of the invention.

With reference to FIG. 3, another embodiment of the enhanced filter is represented.

In this embodiment, the second stage 13 is symmetrical to the one described with reference to FIG. 1. It comprises two inductors 20, 22 series-connected between the direct voltage source V and the output, a capacitor 24 connected in parallel with the inductor 20 connected to the output and a second tuneable capacitor 26 connected in parallel between the direct voltage source and the output.

In this embodiment typical component values are as follows: inductor 20, 4 nH; inductor 22, 10 nH; capacitor 24, 12 pF; and capacitor 26, 2 pF.

The inductor 22 is in series resonance with the capacitor 24 and the inductors 22 and 20 are in parallel resonance with the capacitor 26.

This circuit also present a transfer function similar to the one represented in FIG. 2.

As in the previous embodiment, it is possible to set separately the center value of the amplified range of frequency and the center value of the attenuated range of frequency by setting respectively the values of the first and second tuneable capacitors 24 and 26.

Figure 4:
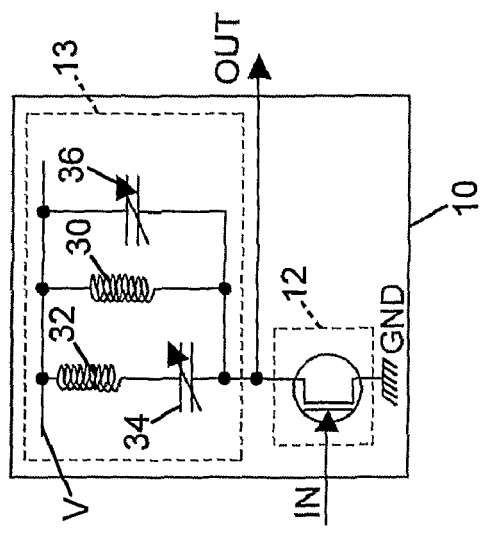

In a third embodiment of the invention, represented with reference to FIG. 4, the second stage 13 comprises an inductor 30 connected between the direct voltage source V and the output and providing a direct current path. It also comprises an inductor 32 and a tuneable capacitor 34 series-connected between the direct voltage and the output and another tuneable capacitor 36 connected in parallel with the first inductor 30.

In this circuit, the inductor 32 and the capacitor 34 are in series resonance while the inductor 30 and the capacitor 36 are in parallel resonance. This circuit performs the same function as the ones described previously, but as no direct current goes through the inductor 32, its design constraints are reduced.

Typical component values for this embodiment are as follows inductor 30, 4 nH; inductor 32, 7 nH; capacitor 34, 5 pF; and capacitor 36, 2 pF.

As previously, this embodiment allows setting a central value for each of the attenuated and amplified ranges of frequency.

In a fourth embodiment described with reference to FIG. 5, the device uses a balanced signal.

Accordingly, the input stage 12 is connected between a positive input IN+ and a negative input IN− and provides two signals. This input stage is conventional and comprises the same kind of circuitry as those described with reference to FIG. 1.

DESCRIPTION OF PREFERRED EMBODIMENTS

Each output of the input stage 12 is fed into a respective second stage 13 connected to the same direct voltage source V. These second stages 13 are identical and can be any of the circuits described previously. In the example described, the second stages are similar to the one described with reference to FIG. 1. Each of the second stages has two series connected inductors 40 and 42. A tuneable capacitor 44 is connected in parallel with the inductor 42 connected to the direct voltage source and another tuneable capacitor 48 is connected in parallel with both inductors.

The device thus has a positive output OUT+ between the input stage and one second stage and a negative output OUT− between the input stage and the other second stage.

Each of the inductors 40 is in series resonance with the corresponding capacitor 44 and each of the overall inductors formed of inductors 40 and 42 is in parallel resonance with the corresponding capacitor 46. This device also have a transfer function similar to the one represented with reference to FIG. 1. However, the use of balanced signals allows more linearity as the even harmonics of the positive and negative signals compensate with each other.

Typical component values are as follow: inductors 40, 10 nH; inductors 42, 4 nH; capacitors 44, 12 pF; and capacitors 46, 2 pF.

In all embodiments, the distance between the center of the attenuated range of frequency and the center of the amplified range of frequency is determined by the values of the components. It is then possible to translate the entire transfer function to higher or lower frequencies by setting the value of the tuneable components.

Figure 5:
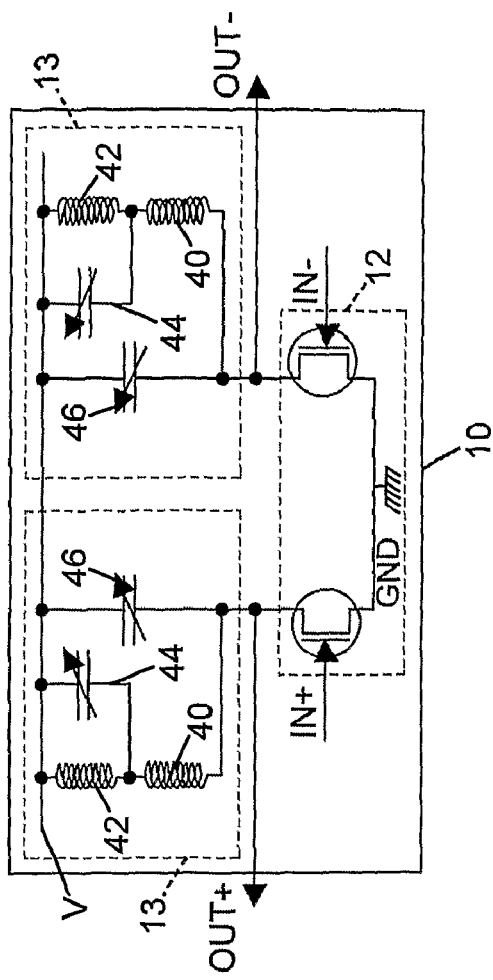
FIG. 5 represents a balanced embodiment of the invention.

However, the second stage as describes with reference to FIGS. 1 and 5 allow more independency in the setting of amplified and attenuated ranges of frequency, each tuneable component acting only on one range.

One aspect of the invention is the use of predetermined ratios between the inductors and between the capacitors.

The value of the first inductor in the direct current path and the value of the second inductor of the circuit are set to ensure the correct resonances between these components and the rest of the circuit.

With the correct predetermined ratios, the circuit has both a parallel resonance for amplification and a series resonance for attenuation.

Advantageously, the value of the second inductor, namely any of the inductors 14, 22, 32 and 40, is set to be not more than four times the value of the first inductor, namely any of the inductors 16, 20, 30 and 42. Even more preferably, the value of the second inductor does not exceed 2.5 times the value of the first inductor.

When the two inductors are in the direct current path the value of the first inductor should not exceed 10 nH. In the embodiment corresponding to FIG. 4, where the direct current path comprises only the first inductor, then the first inductor 30 should be set between 0.3 nH and 30 nH. The second inductor 32 should be set to a value less than 100 nH.

Similarly, the values of the capacitors are also set to ensure the correct resonance. Advantageously, the value of the first capacitor connected in parallel between the direct voltage source and the output, namely any of capacitors 19, 26, 36 and 46 and the value of the second capacitor, namely any of capacitors 18, 24, 34 and 44, should be at the maximum 1 to 10. Accordingly, the value of the second capacitor should not exceed ten times the value of the first capacitor.

Event more preferably, the value of the second capacitor should not exceed six times the value of the first capacitor.

When the two inductors are in the direct current path the value of the second capacitor should not exceed 20 pF. In the embodiment corresponding to FIG. 4, where the direct current path comprises only the first inductor, then the first capacitor 36 should be less than 100 pF and the second capacitor 34 should be between 1 and 100 pf.

The use of such predetermined ratios allows having some selectivity in both amplification and attenuation. If the ratios are not meet, one of attenuation or amplification becomes a side effect or even disappears and in any case is not fine tuneable anymore.

When setting the values of the components one needs to set first either the inductors or the capacitors. Then, the other components values will be set depending on the aimed ranges of frequency, each couple of one inductor and one capacitor setting the central frequency for either the amplified range or the attenuated range.

Of course, other embodiments of the invention are also possible. For example, in one embodiment, the tuneable components are formed of several components each of them series-connected with switch formed by a transistor. The overall value of the components is determined by the control of the transistors thus allowing digital control of these tuneable components.

It is also possible to use tuneable inductors together or instead of tuneable capacitor to set the central value of the amplified and/or attenuated ranges of frequency.

The invention claimed is:

1. Amplifier for radio frequency signals comprising a first stage being connected between the input, a ground and an output and a second stage being connected between the output and a direct voltage source, and wherein said second stage provides a direct current path with a first inductor, the circuit further comprising a first capacitor connected in parallel with said direct current path and a second inductor series-connected with a second capacitor wherein the values of said first and second inductors and of said first and second capacitors are set to have predetermined ratios to amplify the signals within a first range of frequency and simultaneously attenuate the signals within a second range of frequency and wherein each of the couples of inductor and capacitor allows setting of respectively the central attenuation frequency and the central amplification frequency.

2. Amplifier according to claim 1, wherein said direct current path comprises only the first inductor and said second inductor and second capacitor are series-connected between the direct voltage source and the output.

3. Amplifier according to claim 1, wherein said direct current path comprises said first and second inductors series-connected between the direct voltage source and the output and said second capacitor is connected in parallel with one of said two inductors.

4. Amplifier according to claim 1, wherein the value of said second inductor is not more than four times the value of said first inductor.

5. Amplifier according to claim 1, wherein the value of said second capacitor is not more than ten times the value of said first inductor.

6. Amplifier according to claim 1, comprising a first and a second tuneable components, the value of the first tuneable component determining the center of the first range of frequency and the value of the second tuneable component determining the center of the second range of frequency.

7. Amplifier according to claim 1, comprising a first and a second tuneable component which values determines together in combination both the center of the first and second ranges of frequency.

8. Amplifier according to claim 6, wherein at least one tuneable component is formed of several elementary components each series-connected with a controllable switch, the control of said switches determining the overall value of the tuneable component.

9. Amplifier according to claim 1, wherein said circuit is adapted to receive a single input signal.

10. Amplifier according to claim 1, wherein said circuit is adapted to receive a balanced input signal and to output a balanced signal.

11. Amplifier according to claim 7, wherein at least one tuneable component is formed of several elementary components each series-connected with a controllable switch, the control of said switches determining the overall value of the tuneable component.

12. Receiver for digital television signals comprising an analog front end and a demodulation unit, characterized in that said analog front end comprises at least one amplifier for radio frequency signals comprising a first stage being connected between the input, a ground and an output and a second stage being connected between the output and a direct voltage source, and wherein said second stage provides a direct current path with a first inductor, the circuit further comprising a first capacitor connected in parallel with said direct current path and a second inductor series-connected with a second capacitor wherein the values of said first and second inductors and of said first and second capacitors are set to have predetermined ratios to amplify the signals within a first range of frequency and simultaneously attenuate the signals within a second range of frequency and wherein each of the couples of inductor and capacitor allows setting of respectively the central attenuation frequency and the central amplification frequency.

13. Receiver according to claim 12, wherein said direct current path comprises only the first inductor and said second inductor and second capacitor are series-connected between the direct voltage source and the output.

14. Receiver according to claim 12, wherein said direct current path comprises said first and second inductors series-connected between the direct voltage source and the output and said second capacitor is connected in parallel with one of said two inductors.

15. Receiver according to claim 12, wherein the value of said second inductor is not more than four times the value of said first inductor.

16. Receiver according to claim 12, wherein the value of said second capacitor is not more than ten times the value of said first inductor.

17. Receiver according to claim 12, comprising a first and a second tuneable components, the value of the first tuneable component determining the center of the first range of frequency and the value of the second tuneable component determining the center of the second range of frequency.

18. Receiver according to claim 12, comprising a first and a second tuneable component which values determines together in combination both the center of the first and second ranges of frequency.

19. Receiver according to claim 17, wherein at least one tuneable component is formed of several elementary components each series-connected with a controllable switch, the control of said switches determining the overall value of the tuneable component.

20. Receiver according to claim 18, wherein at least one tuneable component is formed of several elementary components each series-connected with a controllable switch, the control of said switches determining the overall value of the tuneable component.

21. Receiver according to claim 12, wherein said circuit is adapted to receive a single input signal.

22. Receiver according to claim 12, wherein said circuit is adapted to receive a balanced input signal and to output a balanced signal.

* * * * *